US010110166B1

(12) United States Patent
Noori

(10) Patent No.: US 10,110,166 B1
(45) Date of Patent: Oct. 23, 2018

(54) LNA WITH VARIABLE GAIN AND SWITCHED DEGENERATION INDUCTOR

(71) Applicant: pSemi Corporation, San Diego, CA (US)

(72) Inventor: Hossein Noori, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 15/616,824

(22) Filed: Jun. 7, 2017

(51) Int. Cl.
*H03F 1/22* (2006.01)
*H03B 5/12* (2006.01)

(52) U.S. Cl.
CPC .......... *H03B 5/1215* (2013.01); *H03B 5/129* (2013.01); *H03B 5/1228* (2013.01); *H03B 5/1259* (2013.01); *H03B 5/1262* (2013.01); *H03B 5/1278* (2013.01); *H03B 5/1287* (2013.01); *H03F 1/223* (2013.01)

(58) Field of Classification Search
CPC ............. H03F 1/22; H03F 1/223; H03F 1/226
USPC ................................................. 330/283, 311
See application file for complete search history.

(56) References Cited

U.S. PATENT DOCUMENTS

| 5,416,356 A * | 5/1995 | Staudinger .............. H01L 27/08 257/531 |
| 9,077,290 B2 | 7/2015 | Din et al. |
| 9,407,215 B2 | 8/2016 | Gill |
| 2014/0240048 A1 * | 8/2014 | Youssef .................. H03F 1/223 330/296 |

OTHER PUBLICATIONS

Zhang, et al., "Linearization Techniques for CMOS Low Noise Amplifiers: A Tutorial", IEEE Transactions on Circuits and Systems—I: Regular Papers, vol. 58, No. 1, Jan. 2011, pp. 22-36.

* cited by examiner

*Primary Examiner* — Steven J Mottola
(74) *Attorney, Agent, or Firm* — Jaquez Land Greenhaus LLP; Martin J. Jaquez, Esq.; Bruce W. Greenhaus, Esq.

(57) ABSTRACT

A receiver front-end capable of receiving RF inputs having a broad range of levels. The receiver comprises a low-noise amplifier (LNA) operating in a variety of bias modes that cover a large gain range. Branches of the amplifier can be turned on in various combinations to allow selection of different bias modes. A degeneration inductor coupled to the source of the common source FET of each branch has a plurality of taps that are coupled to degeneration switches that can ground the tap to effectively shorten the degeneration inductor and reduce the amount of degeneration inductance. The degeneration inductor and associated switches can be fabricated using one of several physical layouts. Operating the degeneration switches to select the length of the degeneration inductor to match the bias mode reduces changes in the input impedance as different bias modes are selected.

16 Claims, 14 Drawing Sheets

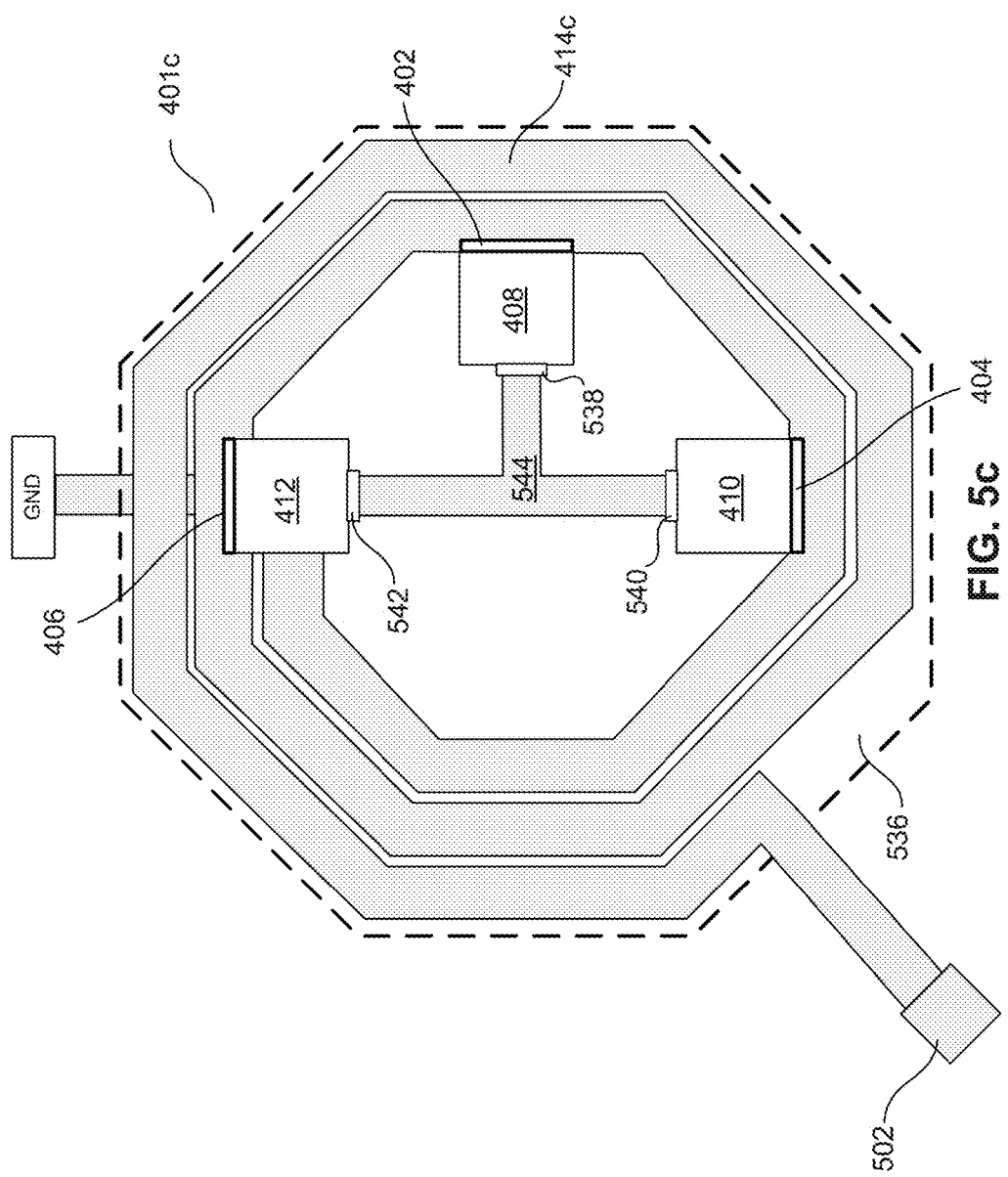

LNA WITH VARIABLE GAIN AND SWITCHED DEGENERATION INDUCTOR

BACKGROUND

(1) Technical Field

Various embodiments described herein relate to amplifiers, and more particularly, to low-noise amplifiers for use in communications equipment.

(2) Background

The front-end of a communications receiver typically includes an amplifier, such as a low-noise amplifier ("LNA"). The LNA is responsible for providing the first-stage amplification to a signal received by the communications receiver. The operational specifications of the LNA are very important to the overall quality of the communications receiver. Any noise or distortion introduced by the LNA will degrade the overall receiver performance. That is, the sensitivity of a receiver is in large part determined by the quality of the front-end, and in particular, by the quality of the LNA. The sensitivity of the receiver, in turn, determines the amount of information that can be transmitted in a predetermined amount of time (e.g., the bit rate in bits per second) at a predetermined bit error rate.

The quality of an LNA is often times characterized by parameters such as the gain, linearity (i.e., third-order intercept point (IP3) and the 1 dB compression point (P1 dB)), noise figure (NF), input impedance match, output impedance match, and the power consumption (i.e., supply voltage and current). These characteristics indicate the amount of distortion likely to be imposed on signals received through the front-end, how strong a signal needs to be and the signal-to-interference-plus-noise ratio (SINR) required to recover information transmitted at a particular data rate. Demand continues to grow for ever higher data rates. High data rates require greater accuracy in the demodulation of signals received by today's receivers. Limitations on the amount of gain that can be applied without imposition of excessive distortion by the front-end of the receiver can limit the data rate at which information modulated on a signal can be accurately demodulated from the signal once received.

In the case of receivers used in wireless communications, such as receivers within cellular telephones, the receiver front-end must also be capable of handling a wide range of input signal levels. Accordingly, state of the art LNAs must have programmable gain, current and linearity. In addition, they must maintain good input and output impedance matching for maximum power transfer with minimum distortion and a low noise figure when the LNA operates at different bias current levels and gain modes.

FIG. 1 shows a simplified illustration of one such state of the art radio frequency (RF) receiver front end 100 having a two-stage cascode LNA 102. Typically, such a state of the art LNA is designed to operate in a "high gain" and "high bias current" mode. Accordingly, the input/output impedance is matched for the high-gain and high-bias-current mode. For lower gain and bias current modes, the current is simply reduced. In addition to reducing the bias current, output and/or input attenuators are used to further reduce the gain.

In the case of RF front-ends for high-end mobile phones, manufacturers require the LNA to operate in different gain and current modes with specified linearity and noise figure. For example, some manufacturers require the LNA to operate in four gain modes: 21 dB, 18 dB, 12 dB and 0 dB. These gain modes typically have bias currents of 10 mA, 8 mA, 6 mA, and 2 mA, respectively. The noise figure requirement for each mode may be 1 dB, 1.2 dB, 3.4 dB and 11.4 dB, respectively. In addition, the linearity for each mode may be specified in terms of an input third-order intercept point (IIP3) of −8 dBm, −8 dBm, −6 dBm and 10.5 dBm, respectively.

In the RF front-end 100 shown in FIG. 1, an RF input signal is coupled to the front-end 100 through an input attenuator module 104. The input attenuator module 104 may be a variable impedance attenuator 106, such as a continuously-variable attenuator or a step attenuator. The input attenuator module 104 typically comprises a bypass switch 108. Closing the bypass switch allows the input signal to be applied directly to the input of an impedance matching and bias network 110 without attenuation. The impedance matching and bias network 110 comprises an input matching inductor 112, a dc-blocking capacitor 114, a bias resistor 116, a variable bias voltage source 118 and a bypass capacitor 120.

The RF input signal is then coupled through an RF input port 121 to the input of the LNA 102 (i.e., the gate of a first field effect transistor (FET) 122 within the LNA 102). A degeneration inductor 124 is coupled to the source of the FET 122. The drain of the FET 122 is coupled to the source of a second FET 126. The gate of the second FET 126 is coupled to a variable bias voltage source 128 and a bypass capacitor 130. The drain of the second FET 126 is coupled to a load inductor 132, an output impedance matching network 134 and a bypass capacitor 135. An output attenuator module 136 comprising a variable attenuator 138, such as a continuously-variable attenuator or a step attenuator, and a bypass switch 139 couples the output signal to the RF front-end output port 140.

The gain of the LNA 102 can be controlled by adjusting a combination of the resistance imposed by the input attenuator module 108, the resistance imposed by the output attenuator module 136, the bias voltage applied to the gate of the first FET 122 and the bias voltage applied to the gate of the second FET 126. That is, by reducing the bias current in each of the FETs 122, 126 of the LNA 102 and adding attenuation to the input and output of the LNA 102, the gain of the RF front end 100 is reduced. However, there are several disadvantages to reducing the gain in this manner.

First, reducing the bias current to force the LNA 102 to operate at lower gain degrades the linearity of the LNA 102. In addition, operating at lower LNA bias current severely degrades the input impedance matching, causing gain, linearity and noise figure degradation. Adding attenuation to the output assists in reducing the gain, but does not result in any improvement in the linearity of the LNA 102. The input attenuator, on the other hand, does improve the impedance match at the input and the linearity for low gain and high noise figure modes of operation. However, a degradation in the noise figure due to the added input attenuation makes it impractical in modes that require a low noise figure.

Furthermore, using attenuator modules 104, 136 requires a relatively large area in the physical layout of an RF front-end 100. In addition, attenuator modules tend to add parasitic capacitance at the input and output, resulting in degradation in the input and output matching, which results in distortion and makes the LNA 102 less efficient. Furthermore, because the gain range may be as great as 24 dB, a large number of input and output attenuators are required.

This complicates the design and, as noted above, significantly increases the die area required to fabricate the LNA 102.

Lastly, in low gain modes, the reduction in the bias current can lead to the LNA 102 moving out of the saturation region. When this happens, there is a significant degradation in the linearity of the LNA 102.

Therefore, there is currently a need for an RF receiver front-end that can operate in several gain, linearity, and/or bias current modes while maintaining reasonable noise figure, and with relatively little change to the input and output impedance.

SUMMARY OF THE INVENTION

A receiver front-end is disclosed that is capable of receiving RF input signals having a broad range of signal levels and operating in a variety of bias modes of the LNA that cover a large gain range. The receiver front-end comprises an amplifier, such as a low-noise amplifier (LNA). The receiver operates at a low noise figure, high third-order intercept point (IP3), with little difference in the input and output impedance of the front-end over the range of bias modes. In accordance with some embodiments of the disclosed method and apparatus, the LNA main-tains a relatively constant current density through the active FETs of the amplifier in all bias modes. In order to maintain the same current density, the LNA's Common-Source amplifier (also known as driver) and Common-Gate amplifier (also known as cascode) are split into a plurality of amplifier branches, each having a "binary-weight". In some embodiments, the binary weight is a function of FET width. As a result, each branch of the LNA carries a current that is proportional to a binary weight. As a result, each branch has a gain that is binary-weighted. This allows branches to be turned on in various combinations to allow selection of a total bias current across the LNA (i.e., operation in different "bias modes") without changing the bias current of any active branch. That is, the bias current in a branch can be turned on and off to make the branch active. However, when active, the bias current is the same each time the branch is activated and remains the same over time. In other embodiments, the branches are "thermometer weighted" wherein each branch has approximately the same bias current and accordingly, the same gain. In other embodiments, the branches are arbitrarily weighted, sometimes referred to as "hybrid coded", in which the branches target specific operating levels rather than a fixed relationship between branches. In whichever case, the total gain of the LNA is the sum of the gain of each branch.

In some embodiments, a degeneration inductor coupled to the source of the common source FET of each branch has a plurality of taps that are coupled to degeneration switches that can ground the tap to effectively reduce the amount of degeneration inductance. Several physical layouts of the degeneration inductor and associated degeneration switches are disclosed, including a spiral square degeneration inductor, a spiral rectangular degeneration inductor, and a spiral octagonal degeneration inductor. Other layouts and configurations of the degeneration inductor and associated degeneration switches are also within the scope of the disclosed method and apparatus. In some embodiments, degeneration switches are controlled to mitigate changes to the real part of the input impedance that correspond to changes in the bias mode.

In some embodiments, a bank of input capacitors can be switched in cooperation with the selection of the active amplifier branches (e.g., selection of the bias modes) to ensure that the reactance at the input of the LNA (i.e., the imaginary part of the input impedance) is the same in each bias mode. When selected, the input capacitors are placed between the gate and source of the driver FETs of the LNA.

Furthermore, in some embodiments, rather than controlling switches to change the degeneration inductance, a second bank of input capacitors can be switched in cooperation with the selection of the amplifier branches to provide flexibility in determining the LNA input impedance and thus further ensure that the impedance at the input of the LNA is the same for each bias mode.

In some embodiments, a selectable bank of "gain control" resistive elements can be placed in parallel with a load inductor to further reduce the gain of the LNA. However, changes to the output impedance can occur due to adding or subtracting the gain control resistive elements. In some embodiments, such changes can be offset by adding or subtracting capacitance in parallel with an output impedance matching capacitor. Adding or subtracting such capacitance can be done using a selectable bank of gain control compensation capacitors.

Still further, in some embodiments, a bank of output capacitors can be selected in cooperation with the selection of the amplifier branches (i.e., selection of the bias mode). Selection of the output capacitors ensures that the capacitive reactance at the output of the LNA is the same in each bias mode. When selected, the output capacitors are placed in parallel with the load inductor.

Lastly, in some embodiments, a post fabrication variable gate to source capacitance is provided to allow measurements of parameters of interest regarding the LNA to be made based on post fabrication tuning of the gate to source capacitance and different bias voltages for the FET of the LNA.

The details of one or more embodiments of the disclosed method and apparatus are set forth in the accompanying drawings and the description below. Other features, objects, and advantages of the disclosed method and apparatus will be apparent from the description and drawings, and from the claims.

DESCRIPTION OF THE DRAWINGS

FIG. 5c is an illustration of the physical layout of another embodiment of a degeneration module in which the degeneration inductor is formed within an octagonal area.

Like reference numbers and designations in the various drawings indicate like elements.

DETAILED DESCRIPTION OF THE INVENTION

Figure 1:
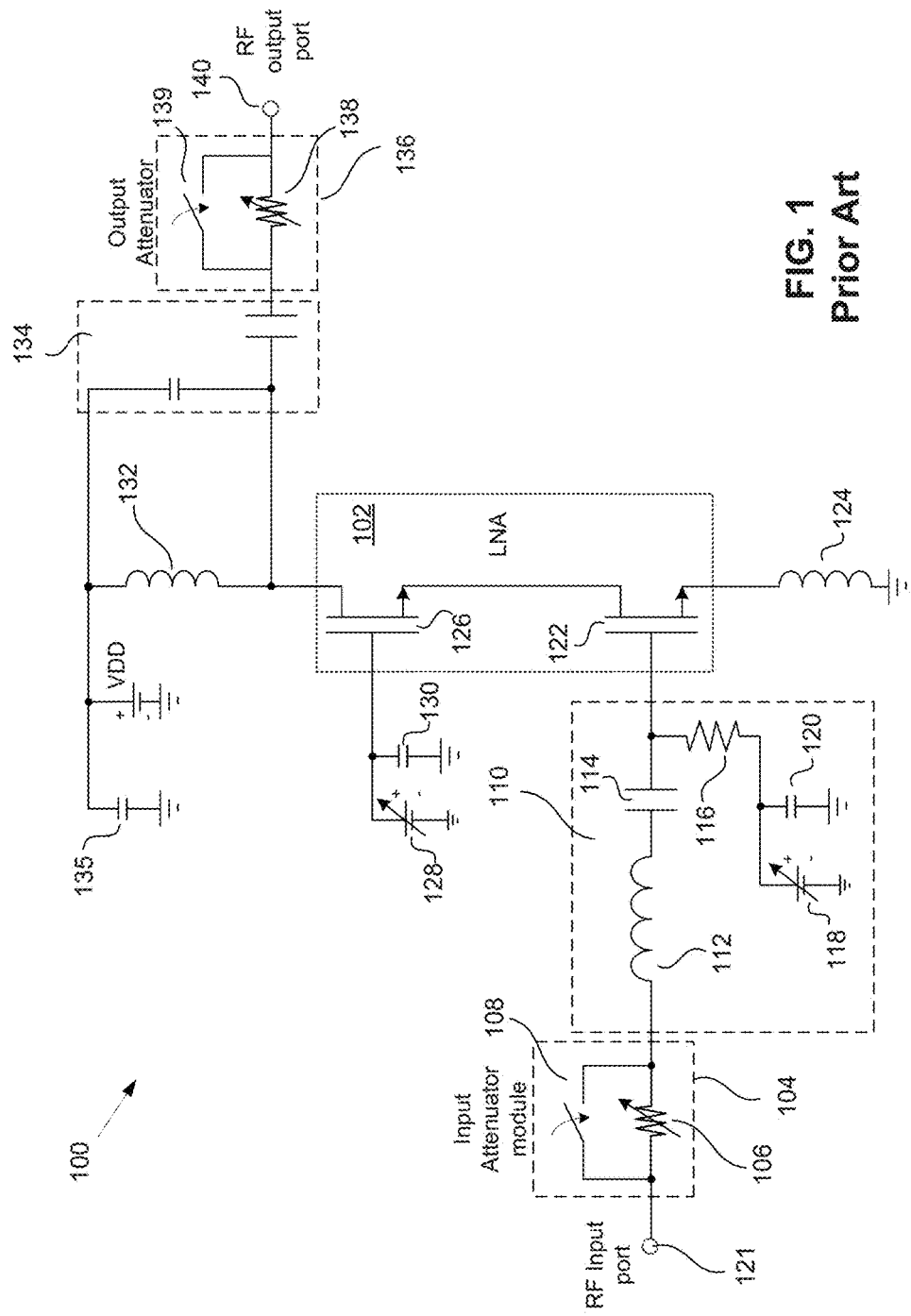
FIG. 1 is an illustration of an LNA of a prior art communications receiver.
Figure 2:
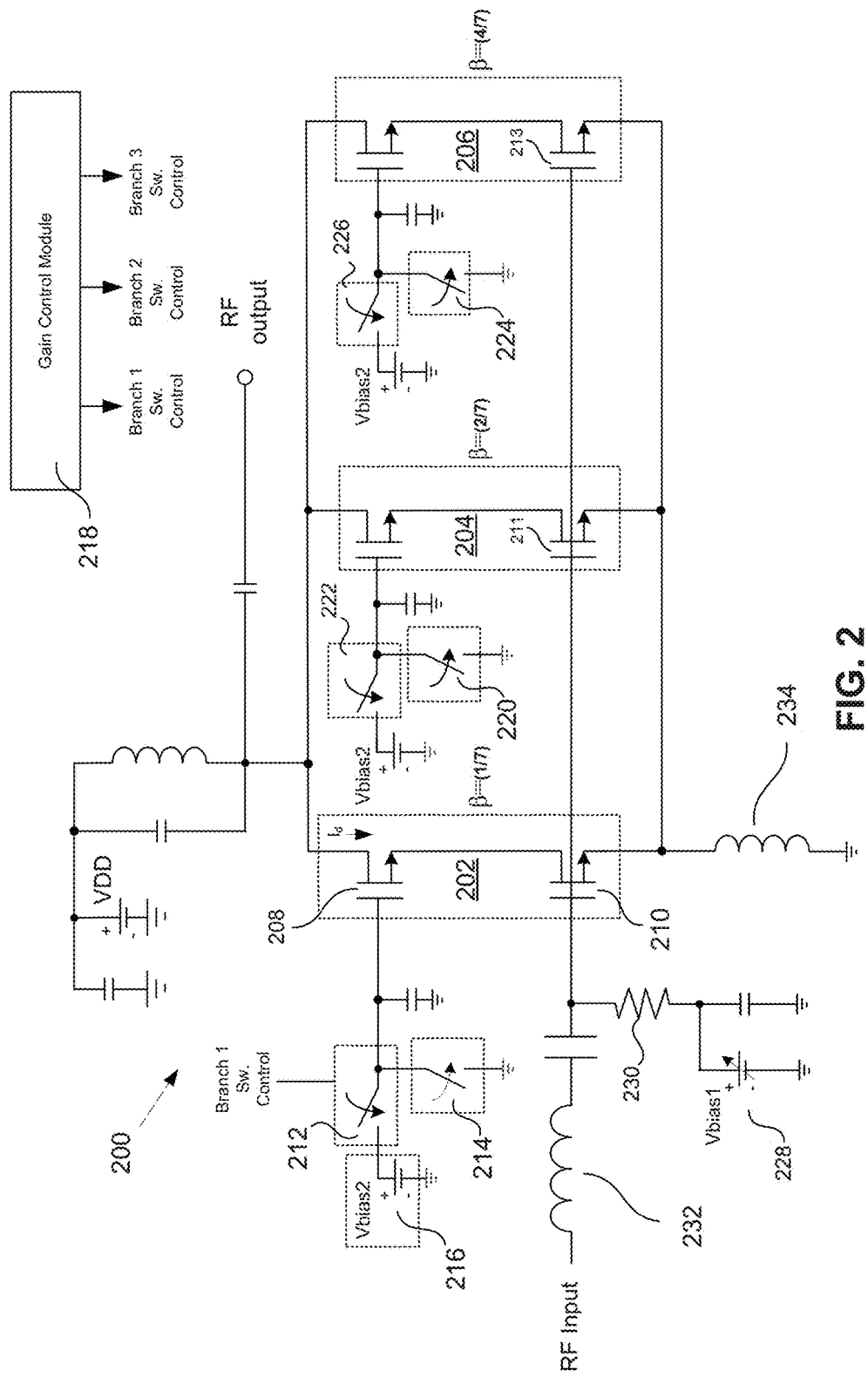
FIG. 2 is a simplified schematic of an LNA of a communications receiver capable of operating in several bias modes of the LNA.

FIG. 2 is a simplified schematic of an LNA 200 in accordance with one example of a communications receiver capable of operating in several bias modes. The LNA 200 comprises a plurality of amplifier branches 202, 204, 206, each branch having an amplifier. The inputs to each of the amplifier branches are coupled together. In some embodiments, each amplifier branch 202, 204, 206 includes a first FET 210 configured as a common-source amplifier (i.e., "driver") and a second FET 208 configured as a common-gate amplifier (i.e., "cascode"). Alternatively, each amplifier branch 202, 204, 206 is configured as a single common source device or a stack of FET devices. In some embodiments, the branches 202, 204, 206 include combinations of the above configurations. For the sake of simplicity, a cascode LNA is described in more detail below. However, it should be understood that the following description applies equally to other configurations of amplifier branches.

In some embodiments, each branch 202, 204, 206 has a "binary-weight". Accordingly, in some such embodiments, the width of the FETs 208, 210 in each branch 202, 204, 206 is proportional to the binary weight of that branch. Accordingly, in some such embodiments, the gain β and the transconductance $g_m$ of each branch are also proportional to the weight of the branch 202, 204, 206. In other embodiments, the relative weight of the branches may be distributed differently, such as in a thermometer weighting, geometric or logarithmic weighting, arbitrary weighting or other weighting scheme.

In the case of a binary weighting scheme, the binary weight of each branch is $2^{i-1}/(2^{(n)}-1)$, where i is the branch number from 1 to n, and n is the total number of branches. In this example, the LNA 200 comprises a total of three branches 202, 204, 206. Therefore, the value of n is 3. The value of i for the first branch is 1. Therefore, the weight of the first branch is $2^0/(2^{(3)}-1)=1/7$. The value of i for the second branch is 2, thus the weight of the second branch is $2^1/(2^{(3)}-1))=2/7$. The value of i for the third branch is 3, thus the weight of the third branch is $2^2/(2^{(3)}-1)=4/7$. The number of branches will depend upon the granularity of weighting steps desired, as will be clear from the following description. In some embodiments, parameters other than gain, such as noise contribution, delivered output power, linearity level, etc. could be the primary metric that is weighted.

In some embodiments, the gain β of each branch is set by establishing the width of the two FETs 208, 210 proportional to the weight. That is, the width of the FET 210 of the first branch is $1/7^{th}$ the width of the amplifier FET that would be needed to achieve the same gain in a conventional LNA that has just one such driver FET (i.e., one branch). Similarly, the width of the FET 208 of the first branch is $1/7^{th}$ the width of a cascode amplifier FET that would be needed to achieve the same gain in a conventional LNA having just one such cascode FET.

The width of the FET 210 of the second branch is $2/7^{th}$ the width of the driver amplifier FET that would be needed to achieve the same gain in a conventional LNA. It should be clear that the width of each other FET 208, 210 is proportional to the binary weight of the branch in which the FET 208, 210 resides.

A pair of branch control switches 212, 214 associated with the first branch 202 controls the bias to the gate of the cascode FET 208 of that branch. A branch 1 switch control signal generated by a gain control module 218 is coupled to a control input of the switch 212. The branch 1 switch control input controls when the branch control switch 212 is to be opened and closed. For the sake of simplicity, only the switch 212 is shown having a control input and branch switch control signal coupled thereto. However, each of the other branch control switches 214, 220, 222, 224, 226 has a similar control input and is controlled by a corresponding switch control signal generated by the gain control module 218.

By opening the branch control switch 212 and closing the switch 214 to ground, the bias provided by a bias voltage source 216 is removed from the gate of a cascode FET 208. Accordingly, the drain current $I_d$ flowing through the branch is turned off, essentially removing that branch 202 from operation and reducing the gain contribution of that branch 202 to the overall gain of the LNA 200 to zero. Similarly, pair of switches 220, 222, 224, 226 associated with the other two branches 204, 206, respectively, turns those branches 204, 206 on and off. In some embodiments, a gain control module 218 produces branch switch control signals that are coupled to switches 212, 214, 220, 222, 224, 226 to allow the gain control module 218 to turn each branch 202, 204, 206 on or off, depending upon the amount of gain desired. The LNA 200 can thus be operated in steps of $1/7^{th}$ the maximum gain. That is, with only the first branch 202 turned on, the LNA 200 will operate at $1/7^{th}$ maximum gain. With only the second branch 204 turned on, the LNA 200 will operate at $2/7^{th}$ maximum gain. With both the first and the second branch 202, 204 turned on, the LNA 200 will operate at $3/7^{th}$ maximum. With only the third branch 206 turned on, the LNA 200 will operate at $4/7^{th}$ maximum gain, etc.

Splitting the LNA 200 into several branches 202, 204, 206 allows the bias current through each FET 208, 210 to remain constant at a bias current level at which the branch was designed to operate.

When a branch 202, 204, 206 is turned OFF, its common-gate amplifier formed by the cascode (FET 208 for branch 202, for example) is turned OFF by grounding its gate. Thus, the FET 208 does not draw current. However, in some embodiments, the common-source amplifier formed by FET 210 is not OFF. Rather, that FET 210 is in "triode" mode, as its gate is still biased. Therefore, as the different branches are turned on and off, the input impedance of the LNA 200 may change. As noted above, this is undesirable, since it will typically result in a degradation of the return loss of the LNA. This is mitigated in some embodiments, in which the input impedance of the LNA 200 is maintained constant for different bias modes (i.e., with different combinations of branches being turned on). It can be seen that the input impedance of the LNA is equal to:

$$Z_{in} = j\omega L_G + \frac{1}{j\omega(C_{gs1} + C_{gs3} + C_{gs5})} + j\omega L_1 + \frac{g_{m1} + g_{m3} + g_{m5}}{C_{gs1} + C_{gs3} + C_{gs5}}L_1 \quad \text{EQ. 1}$$

where:
$L_G$ is inductance of the input inductor 232;
$L_1$ is the inductance of the degeneration inductor 234;
$C_{gs1}$, $C_{gs3}$, $C_{gs5}$ are the gate to source capacitances of the FETs 210, 211, 213, respectively; and $g_{m1}$, $g_{m3}$, $g_{m5}$ are the transconductance of the branches 202, 204, 206, respectively.

It can be seen from EQ. 1 that the real part of the input impedance $Z_{in}$ is equal to the fourth term of the equation EQ. 1.

Figure 3:
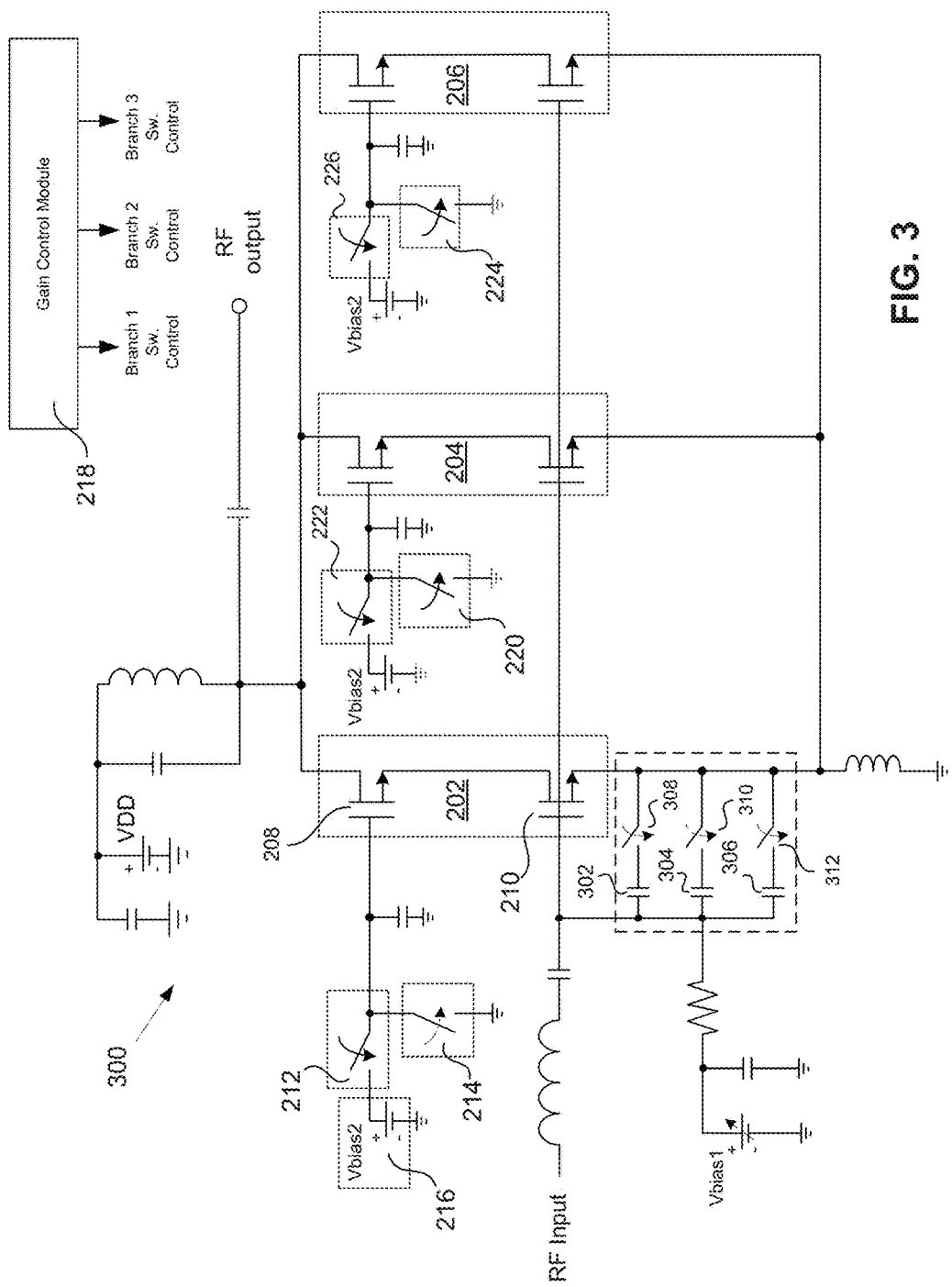
FIG. 3 is a simplified schematic of an LNA similar to that of FIG. 2, but having a bank of input capacitors that can be selectively placed between a gate and a source of the common source FETs of the amplifier branches of the LNA.

FIG. 3 is an illustration of one embodiment of an LNA 300 similar to the LNA 200 shown in FIG. 2. However, the LNA 300 shown in FIG. 3 comprises a bank of selectable gate-to-source compensation capacitors (GSC Caps) 302, 304, 306. Each GSC Cap 302, 304, 306 corresponds with one of the branches 202, 204, 206 of the LNA 300. Each GSC Cap 302, 304, 306 is coupled to a GSC Cap switch 308, 310, 312 to allow the GSC Cap 302, 304, 306 to be selected. The gate to source capacitance $C_{gs}$ within a FET changes depending on whether the FET is in the saturation region or triode region, thereby changing the input impedance of the LNA 300. In some embodiments, the capacitance of each of the GSC Caps 302, 304, 306 is set equal to the difference between the $C_{gs1}$ of the FET 210 in saturation region and the $C_{gs1}$ of the FET 210 in triode region. Combinations of the GCS Caps 302, 304, 306 are thus selected to mitigate changes in the input impedance in each of the possible bias modes. That is, the resulting change in the input reactance of the LNA 300 due to the change of the $C_{gs}$ of FETs 210 from saturation region to triode region can be mitigated (and essentially eliminated) by closing the GSC Cap switch 308, 310, 312 associated with those branches that are turned off.

In some embodiments, each of the GSC Cap switches 308, 310, 312 is controlled by the gain control module 218, such that the GSC Cap switch 308, 310, 312 coupled to the GSC Cap 302, 304, 306 is closed when the corresponding branch 202, 204, 206 of the LNA 300 is turned off. The GSC Cap switch is then opened when the corresponding branch is turned on. Adding capacitance between the gate and the source of the driver FETs of each branch 202, 204, 206 of the LNA 300 compensates for the difference between the input impedance in each of the different operational modes.

In addition to changes in the gate to source capacitance of the common-source FETs (such as the FET 210), the transconductance $g_{m1}$, $g_{m3}$, $g_{m5}$ of each branch 202, 204, 206 is zero when that branch is not turned on. As can be seen from input impedance equation EQ. 1 presented above, changing the transconductance $g_m$ of one or more of the branches to zero by turning off the branches will significantly impact the last term of the input impedance equation EQ. 1. The last term of EQ. 1 represents the real part of the input impedance. For example, the real part of the input impedance when the third branch 206 is off equals:

$$\text{Re}\{Zin\}_{B3off} = \frac{g_{m1} + g_{m3}}{C_{gs1} + C_{gs3} + C_{gs5}}L_1 \quad \text{EQ. 2}$$

Figure 4A:
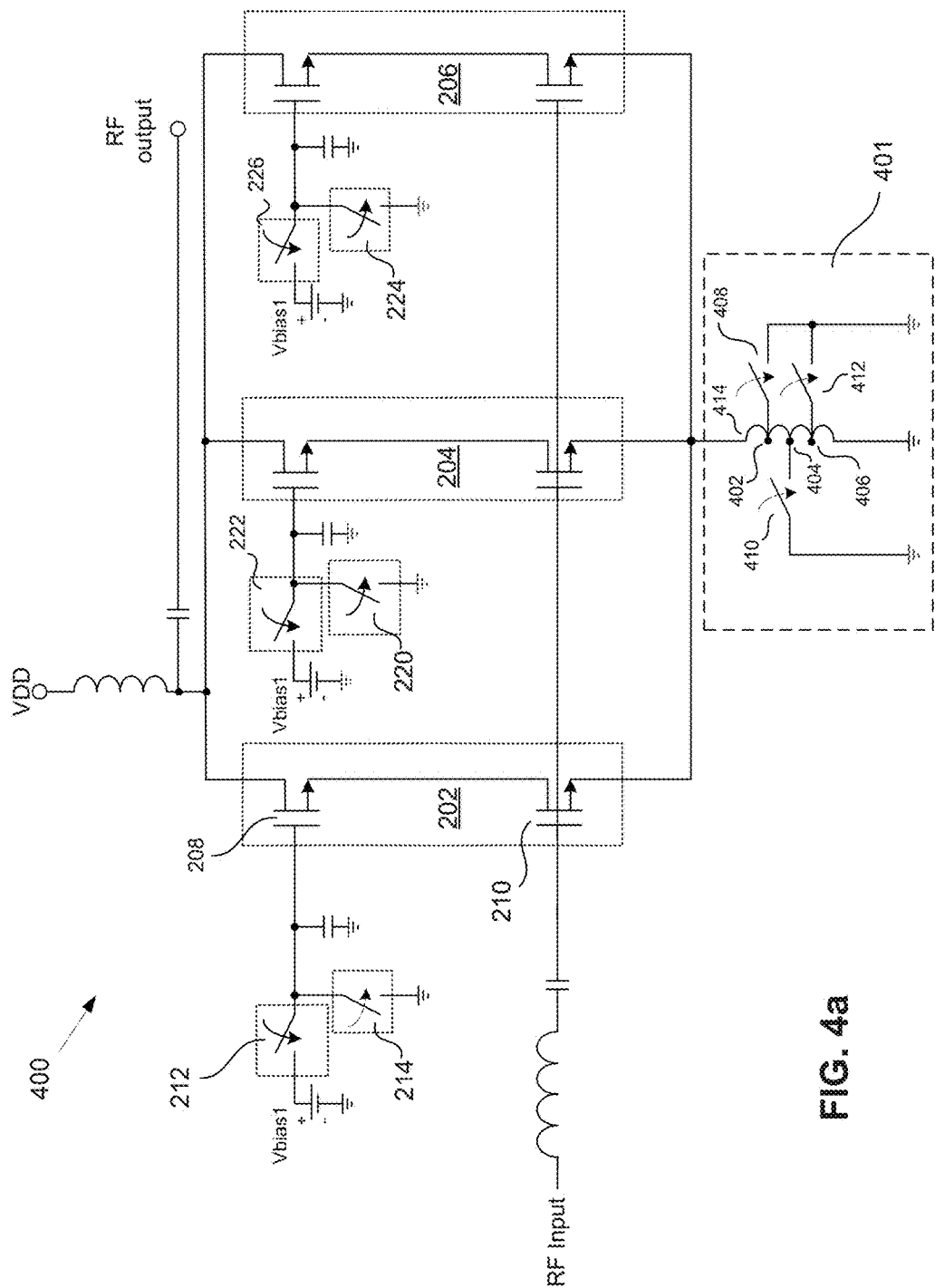
FIG. 4a is a simplified schematic of an LNA having a degeneration module comprising a degeneration inductor that has a selectable inductance.

FIG. 4a illustrates an LNA 400 having a degeneration module 401 comprising a degeneration inductor 414 that has a selectable inductance. Increasing the amount of inductance, $L_1$ coupled between the source of each FET 210 and ground, offsets changes in the transconductance $g_m$. For example, it can be seen that the transconductance $g_m$ changes from that shown in the numerator of Equation 1 to that shown in the numerator of EQ. 2. The degeneration inductor 414 has three taps 402, 404, 406. Each tap 402, 404, 406 is coupled to a respective one of three degeneration switches 408, 410, 412 within the degeneration module 401. Sequentially opening each switch 408, 410, 412 effectively increases the length of the inductor and thus increases the inductance $L_1$ of the degeneration inductor 414. In some embodiments, each of the degeneration switches 408, 410, 412 has a control input that is coupled to the gain control module 218. It should be noted that the gain control module 218 is not shown in FIGS. 4a, 4b, 4c, 6, 7 and 8 for the sake of simplicity. The gain control module 218 coordinates control of the degeneration switches 408, 410, 412 by determining the appropriate position for each switch 408, 410, 412 and generating the switch control signals to control each degeneration switch 408, 410, 412 (i.e., either open or close the switches) based on the bias mode (i.e., the positions of the branch control switches 212, 214, 220, 222, 224, 226).

Having three degeneration switches 408, 410, 412 allows the degeneration module 401 to operate with four different values of inductance. It should be noted that this would correspond to the LNA 400 have at least four different bias modes. In some embodiments, this is accomplished by at least one of the branches 202, 204, 206 having a gain β, bias current and transconductance $g_m$ that is greater than or less than that of at least one of the other two branches. In one such case, the branches are binary-weighted. Accordingly, operating the LNA 400 in bias modes in which different combinations of the branches are active will result in the LNA 400 having different bias modes with different gains β, bias currents and transconductance $g_m$.

The smallest value of inductance is provided with the first switch 408 closed. The degeneration module 401 provides an inductance with the first switch 408 closed that results in the input impedance $Z_{in}$ of the LNA 400 matching the characteristic impedance of the system in which the LNA 400 is being used during operation in the bias mode that provides the highest gain (i.e., with all of the branches 202, 204, 206 active).

With the first switch 408 open and the second switch 410 closed, the inductance of the degeneration module 401 is equal to a value that results in the input impedance $Z_{in}$ of the LNA 400 matching the characteristic impedance of the system when the LNA 400 is operating in a bias mode that provides a first mid-level gain (e.g., operation with two of the branches 202, 204, 206 active).

With the first and second switches 408, 410 open and the third switch 412 closed, the inductance of the degeneration module 401 is equal to a value that results in the input impedance $Z_{in}$ of the LNA 400 matching the characteristic impedance of the system when the LNA 400 is operating in a second mid-level gain (with a different pair of branches 202, 204, 206 active). The second mid-level gain is less than the first mid-level gain.

Finally, with all three switches 408, 410, 412 open, the inductance of the degeneration module 401 is equal to the maximum inductance value, which results in the input impedance $Z_{in}$ of the LNA 400 matching the characteristic impedance of the system when the LNA 400 is operating in a bias mode that provides the minimum gain (i.e., the branch that has the smallest value of transconductance $g_m$ being active). Accordingly, the input impedance $Z_{in}$ remains essentially equal to the characteristic impedance of the system in which the LNA 400 is being used as the bias mode of the LNA 400 changes.

The placement of the taps 402, 404, 406 and number of such taps can be selected to achieve particular values of degeneration inductance $L_1$, as desired. As can be seen from the above description, the total inductance of the degeneration inductor 414 (the inductance with all switches open) and the placement of the taps 402, 404, 406, provide a mechanism to compensate for changes in the input impedance as a consequence of changes in the transconductance $g_m$ of the LNA 400 when the LNA 400 changes bias modes.

Figure 4B:
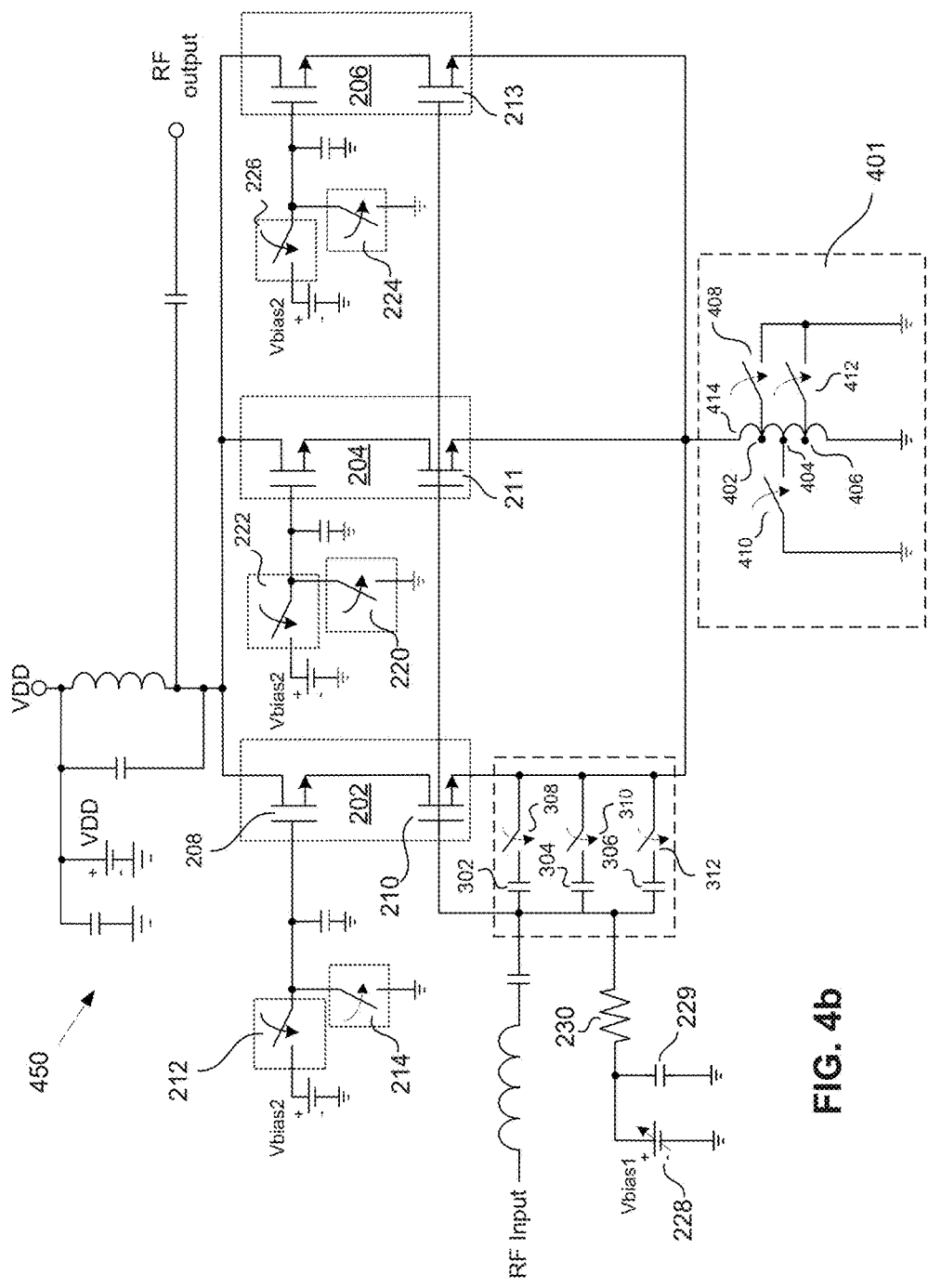
FIG. 4b is a simplified schematic of an LNA similar to the LNA of FIG. 4a, but with a bank of selectable gate-to-source compensation capacitors.

FIG. 4b is a simplified schematic of an LNA 450 similar to the LNA 400 of FIG. 4a. However, in addition to the degeneration module 401, the LNA 450 has a bank of selectable GSC Caps 302, 304, 306 similar to the LNA 300 of FIG. 3. In addition, similar to the LNA 300, the LNA 450 has a bias source 228 to establish a bias for the common-source FETs 210, 211, 213 of each branch 202, 204, 206. A capacitor 229 is coupled in parallel with the bias source 228. A resistor 230 is coupled between the capacitor 229 and the gate of each of the common-source FETs 210 of each branch 202, 204, 206.

Figure 4C:
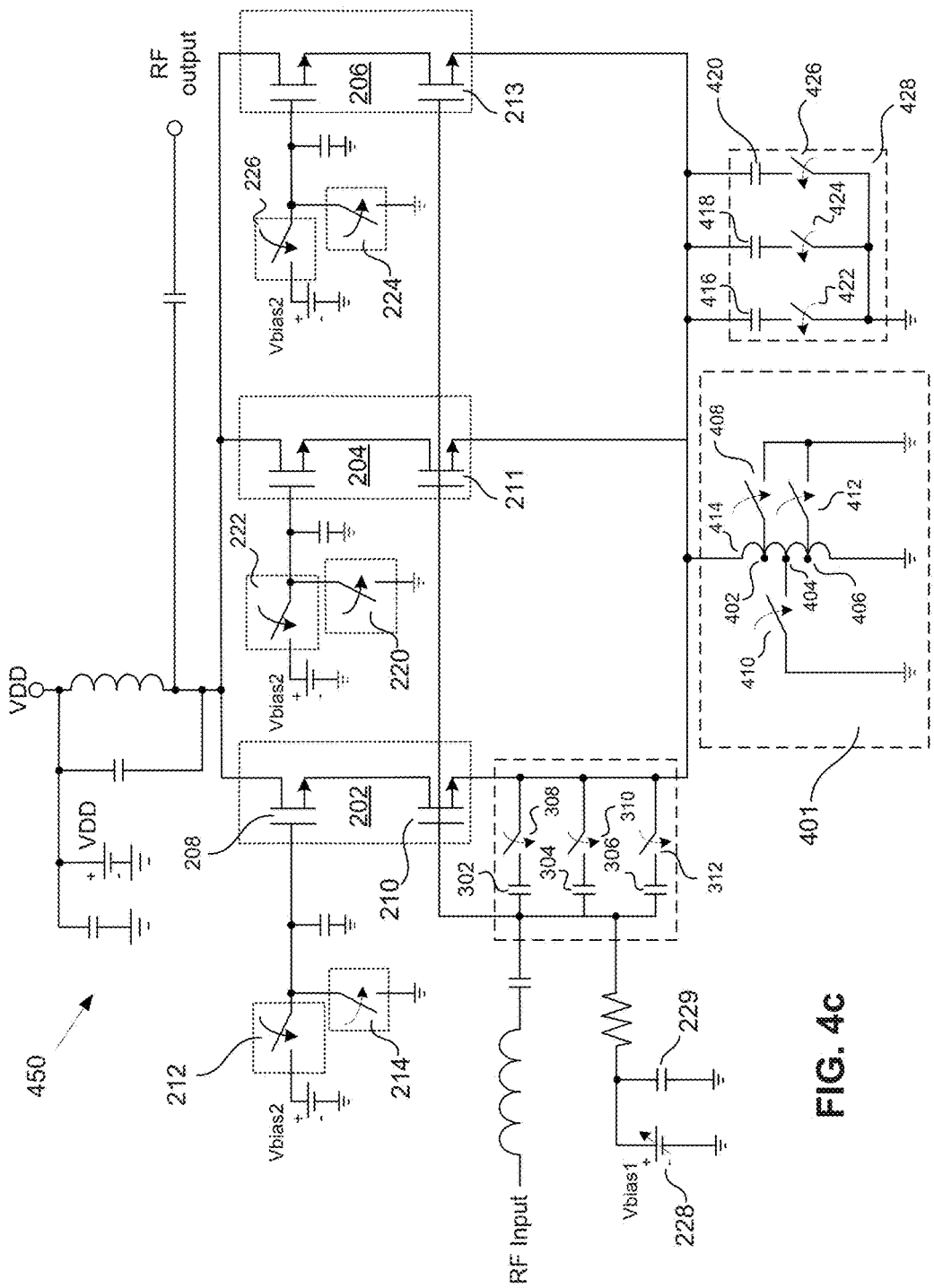
FIG. 4c is a simplified schematic of an LNA having switchable capacitors in parallel with the degeneration inductor.

Other techniques for increasing the effective inductance of the degeneration inductance 414 include placing capacitors in parallel with the degeneration inductor 414. FIG. 4c is a simplified schematic of an LNA 450 having such capacitors 416, 418, 420. However, such parallel capacitors 416, 418, 420 decrease the output-to-input isolation (S-parameter $S_{12}$) of the LNA. In contrast, the use of switches 408, 410, 412 to alter the length of the degeneration inductor increases the $S_{12}$ parameter as the inductance increases. Furthermore, increasing the effective inductance of the degeneration inductor 414 by placing capacitors in parallel with the degeneration inductor 414 can result in lowering the self-resonant frequency (SRF) of the degeneration inductor 414, causing the LNA to be less stable under some operating conditions. Still further, such parallel capacitors may require more real estate (i.e., die area) than is required when using switches 408, 410, 412 to extend the length of the degeneration inductor 414. Nonetheless, in some embodiments, switched capacitors 416, 418, 420 and associated series degeneration capacitor switches 422, 424, 426 form a switchable impedance module 428 in parallel with the degeneration inductor 414 that can be used in combination with various taps on the degeneration inductor 414 that can be switched to ground to alter the degeneration inductance 414 for various bias modes.

Figure 5A:
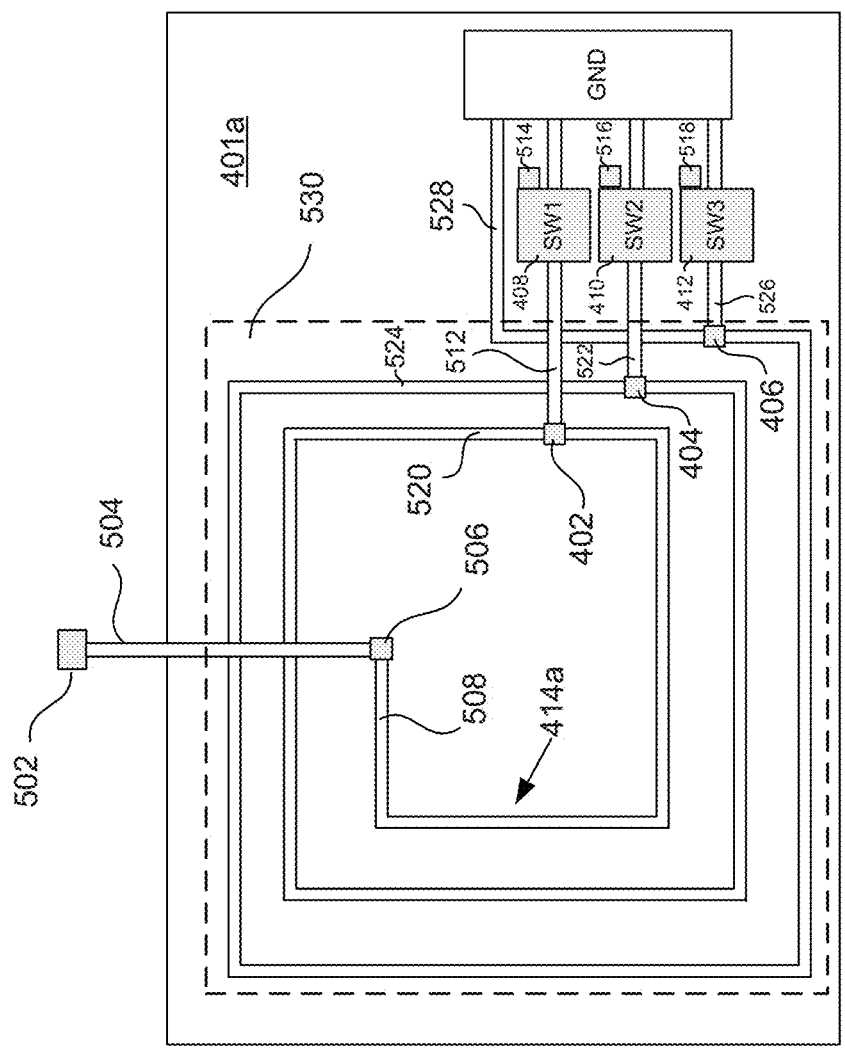
FIG. 5a is an illustration of one example of a physical layout of the degeneration module in accordance with some embodiments in which the degeneration inductor is formed within a square area.

FIG. 5a is an illustration of one example of a physical layout of the degeneration module 401a. An input 502 to the degeneration module 401a is coupled to a first portion of the degeneration inductor 414a. The example degeneration inductor 414a shown in FIG. 5a includes five sections. The first section 504 is formed in a first conductive layer of an integrated circuit (IC). It should be noted that the terms "first conductive layer", "second conductive layer", etc., are used merely to denote different layers, and not necessarily a particular hierarchy, physical ordering or spatial relationship. This first section 504 couples the input 502 to a first "via" 506. As is the case with the references to the conductive layers, the use of the term "first", "second", etc. is not intended to indicate a particular hierarchy, physical ordering or spatial relationship between the vias. Vias are conductive elements that electrically connect structures formed on one conductive layer with structures formed on another conductive layer of an IC. The first via 506 couples the first section 504 formed on the first conductive layer with the second section 508 formed on a second conductive layer of the IC. In some embodiments, additional conductive layers may lie between the first and second conductive layer. The second section 508 of the degeneration inductor 414a traverses a path from the first via 506 to the tap 402.

A via at the tap 402 couples the tap 402 to a conductor 512 formed on the first conductive layer of the IC. The conductor 512 couples the tap 402 to a first contact of the switch 408. A control input of the switch 408 is coupled to a contact pad 514 for receiving a control input signal to control the operation of the switch 408 (i.e., to allow the switch to be opened and closed). A second contact of the switch 408 is coupled to ground such that when the switch 408 is closed, the tap 402 is coupled through the switch 408 to ground. It should be noted that, for the sake of simplicity, the control input to the switch 408 is not shown in the schematic of FIG. 4a, 4b or 4c.

A third section 520 of the degeneration inductor 414a is formed by a conductor on the second conductive layer of the IC. The third section 520 of the degeneration inductor 414a couples the tap 402 to the tap 404 along a path that results in a desired additional inductance being added to the degeneration inductor 414a when the switch 408 is open. A via at the second tap 404 connects the tap 404 to a conductor 522 on the first conductive layer of the IC. The conductor 522 couples the tap 404 to a first contact of the switch 410. A second contact of the switch 410 is coupled to ground. A control input for the switch 410 is coupled to a contact pad 516 for receiving a control input signal to control the operation of the switch 410.

A fourth section 524 of the degeneration inductor 414a is formed by a conductor on the second conductive layer of the IC. The fourth section 524 of the degeneration inductor 414a couples the tap 404 to the tap 406 along a path that results in a desired additional inductance being added to the degeneration inductor 414a when both switch 410 and switch 408 are open. Since the section 524 is formed on the second conductive layer, it can cross the conductor 512 formed on the first conductive layer without making electrical contact. A via at the third tap 406 connects the tap 406 to a conductor 526 on the first conductive layer of the IC. The conductor 526 couples the tap 406 to a first contact of the switch 412. A second contact of the switch 412 is coupled to ground. A control input for the switch 412 is coupled to a contact pad 518 for receiving a control input signal to control the operation of the switch 412.

The fifth section 528 of the degeneration inductor 414a is formed by a conductor on the second conductive layer of the IC. The fifth section 528 of the degeneration inductor 414a couples the tap 406 to ground along a path that results in a desired additional inductance being added to the degeneration inductor 414a when switches 408, 410, 412 are open. Since the section 528 is formed on the second conductive layer, it can cross the conductors 512, 522 formed on the first conductive layer without making electrical contact.

The five sections 504, 508, 520, 524, 528 of the degeneration inductor 414a form a spiral inductor that fits within a square area 530 of the IC. The switches 408, 410, 412 that control the amount of inductance provided at the input 502 of the degeneration module 401a lie outside the square area 530.

Figure 5B:
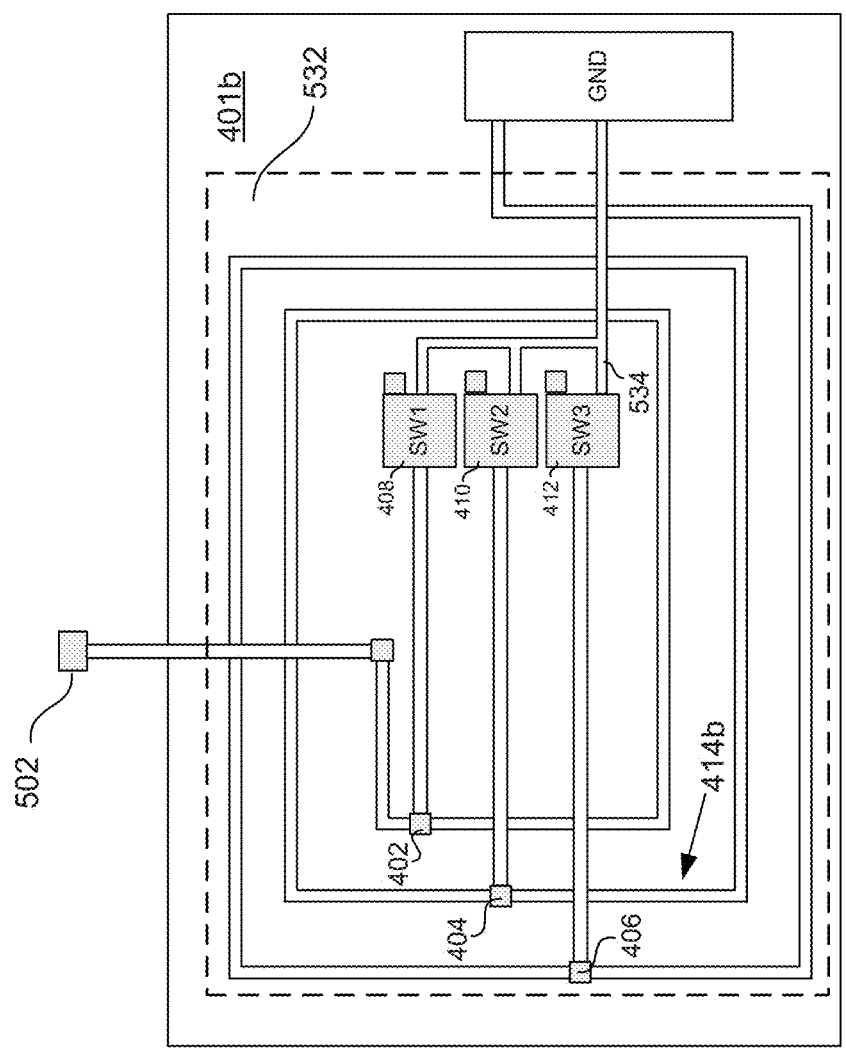
FIG. 5b is an illustration of the physical layout of another embodiment of a degeneration module in which the degeneration inductor is formed within a rectangular area.

FIG. 5b is an illustration of the physical layout of another embodiment of a degeneration module 401b. The degeneration module 401b includes a degeneration inductor 414b that fits within a rectangular area 532. The input 502 to the degeneration module 401b is coupled to the degeneration inductor 414b. The conductor that forms the degeneration inductor 414b is formed around the switches 408, 410, 412, such that the switches 408, 410, 412 are physically in the interior of the spiral degeneration inductor 414b. Three taps 402, 404, 406 are formed along the degeneration inductor 414b. A first contact of each switch 408, 410, 412 is coupled to a corresponding tap 402, 404, 406, as shown in both FIG. 5b and the schematic of FIGS. 4a, 4b, and 4c. A second contact of each switch 408, 410, 412 is coupled to ground by a conductor 534. The degeneration module 401b operates essentially the same as the degeneration module 401a described above. That is, by selectively opening and closing the switches 408, 410, 412, the inductance of the degeneration inductor 414b can be increased and decreased.

FIG. 5c is an illustration of yet another physical layout of an alternative embodiment of a degeneration module 401c. The degeneration module 401c includes a degeneration inductor 414c that fits within an octagonal area 536. The three switches 408, 410, 412 are formed in the interior of the spiral octagonal degeneration inductor 414c. A first contact of each switch 408, 410, 412 is coupled to each of the three taps 402, 404, 406, respectively. A second contact 538, 540, 542 of each switch 408, 410, 412 is coupled to a conductor 544. The conductor 544 is routed under the conductor that forms the degeneration inductor 414c and is coupled to ground. The degeneration module 401c operates essentially the same as the degeneration module 401a and 401b described above. That is, by selectively opening and closing the switches 408, 410, 412, the inductance of the degeneration inductor 414c can be increased and decreased. In general, forming the degeneration inductor in the shape of a spiral within an octagonal area results in a generally efficient inductance within a given area. This is also true of a degeneration inductor having a generally spiral shape formed within a circular geometry. But the degeneration inductor 414c can be formed using any arbitrary array of inductive elements.

Figure 6:
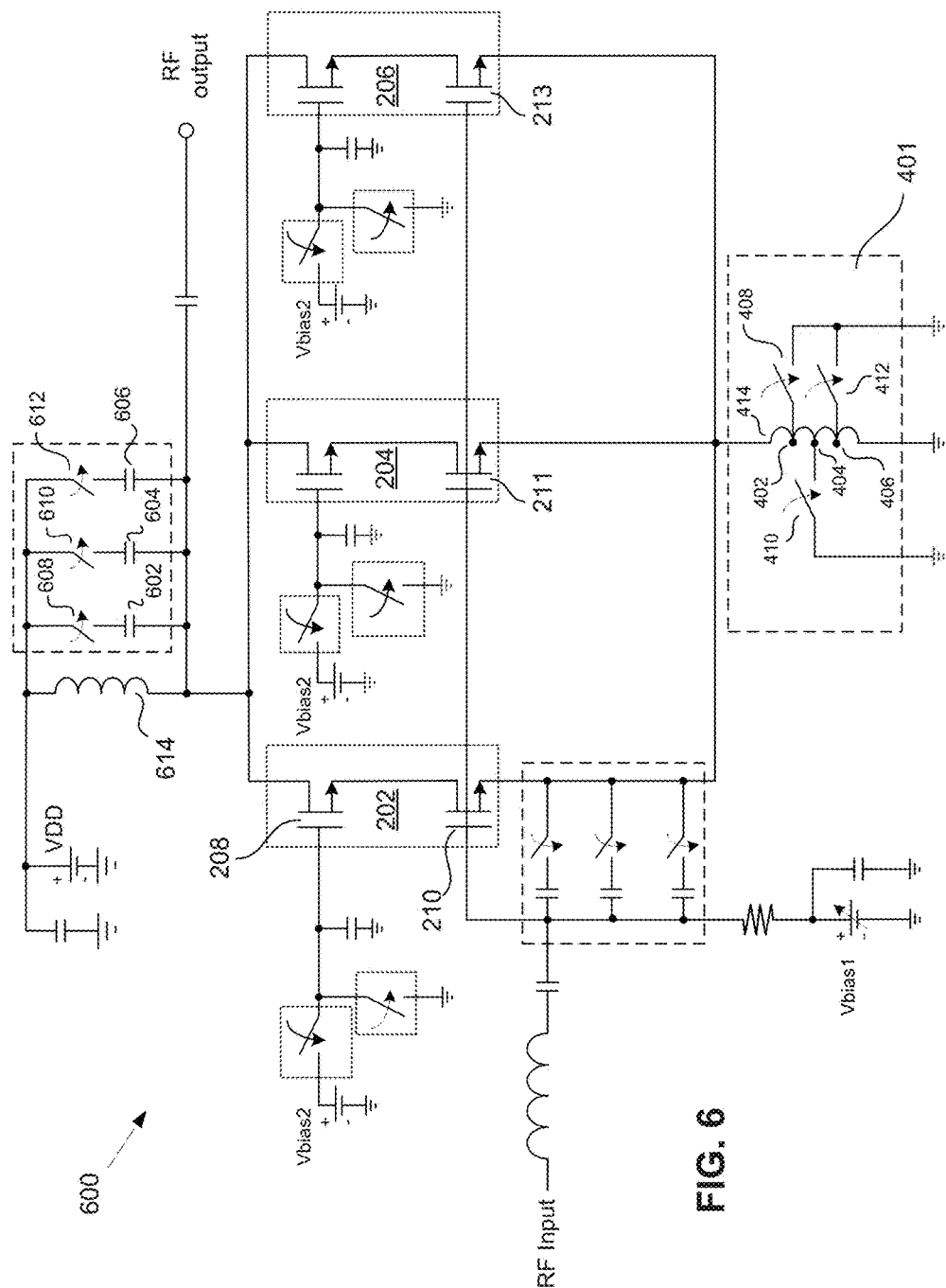
FIG. 6 is a simplified schematic of the LNA of FIG. 4b, additionally having compensation provided to ensure that the output impedance of the LNA remains constant in each bias mode.

FIG. 6 is simplified schematic of another embodiment of an LNA 600 having a selectable inductance degeneration inductor module 401, in addition to other compensation circuits. In the LNA 600, compensation is provided to ensure that the output impedance of the LNA 600 remains constant in each bias mode. The LNA 600 has a load inductor 614 coupled between a voltage supply VDD and the drains of the common-gate FETs 208. The compensation for changes that would otherwise occur in the output impedance is provided by a third bank of output impedance compensation (OIC) capacitors 602, 604, 606 that can each be placed in parallel with the load inductor 614 by closing an associated switch 608, 610, 612. That is, when a branch 202, 204, 206 of the LNA is turned off, the output impedance decreases. This results in an output impedance mismatch. By providing additional capacitance in parallel with the load impedance 614 when a branch 202, 204, 206 is turned off, the mismatch can be improved. Accordingly, each of the three switches 608, 610, 612 is associated with one of the three branches 202, 204, 206. When a branch 202, 204, 206 is turned off, the associated switch 608, 610, 612 is closed. As was the case in the LNAs 400, 300 discussed above, a gain control module 218 (not shown in FIGS. 4, 6, 7 and 8 to simplify the figures) can be provided to control and coordinate the operation of the branches 202, 204, 206 and the switches.

Figure 7:
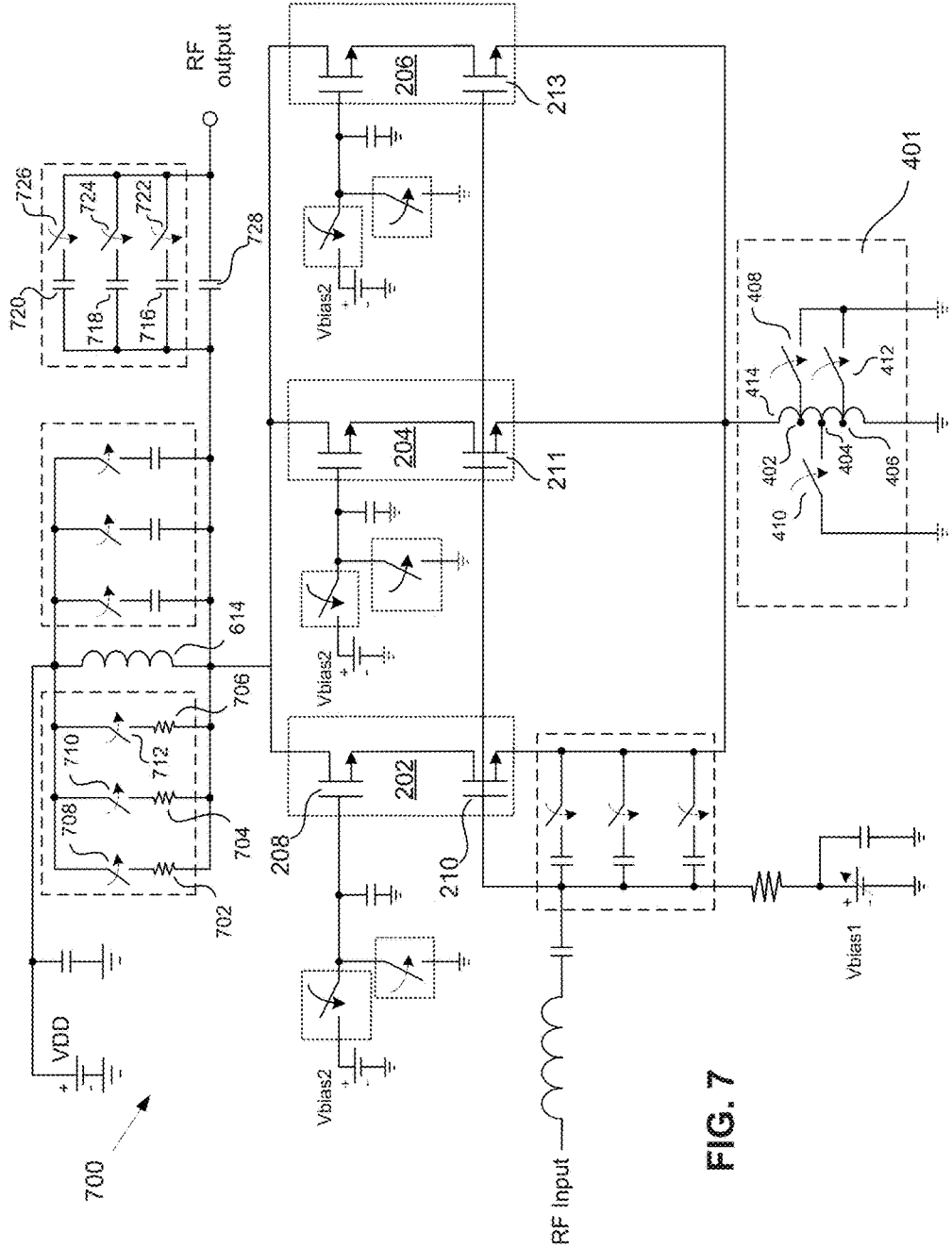
FIG. 7 is a simplified schematic of the LNA of FIG. 6, additionally having a bank of gain control resistors and a bank of gain control compensation capacitors.

FIG. 7 is a simplified schematic of yet another embodiment of an LNA 700 having a selectable inductance degeneration inductor module 401 and also having a bank of gain control resistors 702, 704, 706. Each of the gain control resistor 702, 704, 706 is associated with a gain control switch 708, 710, 712 that places the associated gain control resistor 702, 704, 706 in parallel with the load inductor 614. By closing the switch 708, 710, 712 associated with each of the gain control resistors 702, 704, 706, the gain of the LNA 700 can be reduced, providing additional control over the gain of the LNA 700. The gain control switches 708, 710, 712 can be operated independently to alter the gain in various bias modes. However, the same gain control module 218 used to turn the branches on and off can provide additional control outputs that open and close the switches 708, 710, 712. Adding additional gain control resistor in parallel with the load inductor 614 will change the output impedance of the LNA 700. Accordingly, in some embodiments, an additional degree of freedom to alter the output impedance is provided by a bank of gain control compensation capacitors 716, 718, 720, each associated with a switch 722, 724, 726 that can place the associated capacitor in parallel with an output capacitor 728. The gain control compensation capacitors 716, 718, 720 are tuned to have values that will mitigate changes to the output impedance that would otherwise occur for each combination of gain control switches being opened or closed. Providing the gain control compensation capacitors 716, 718, 720 makes it possible to keep the output impedance essentially the same when different combinations of gain control resistors 702, 704, 706 are placed to be in parallel with the load inductor 614.

Figure 8:
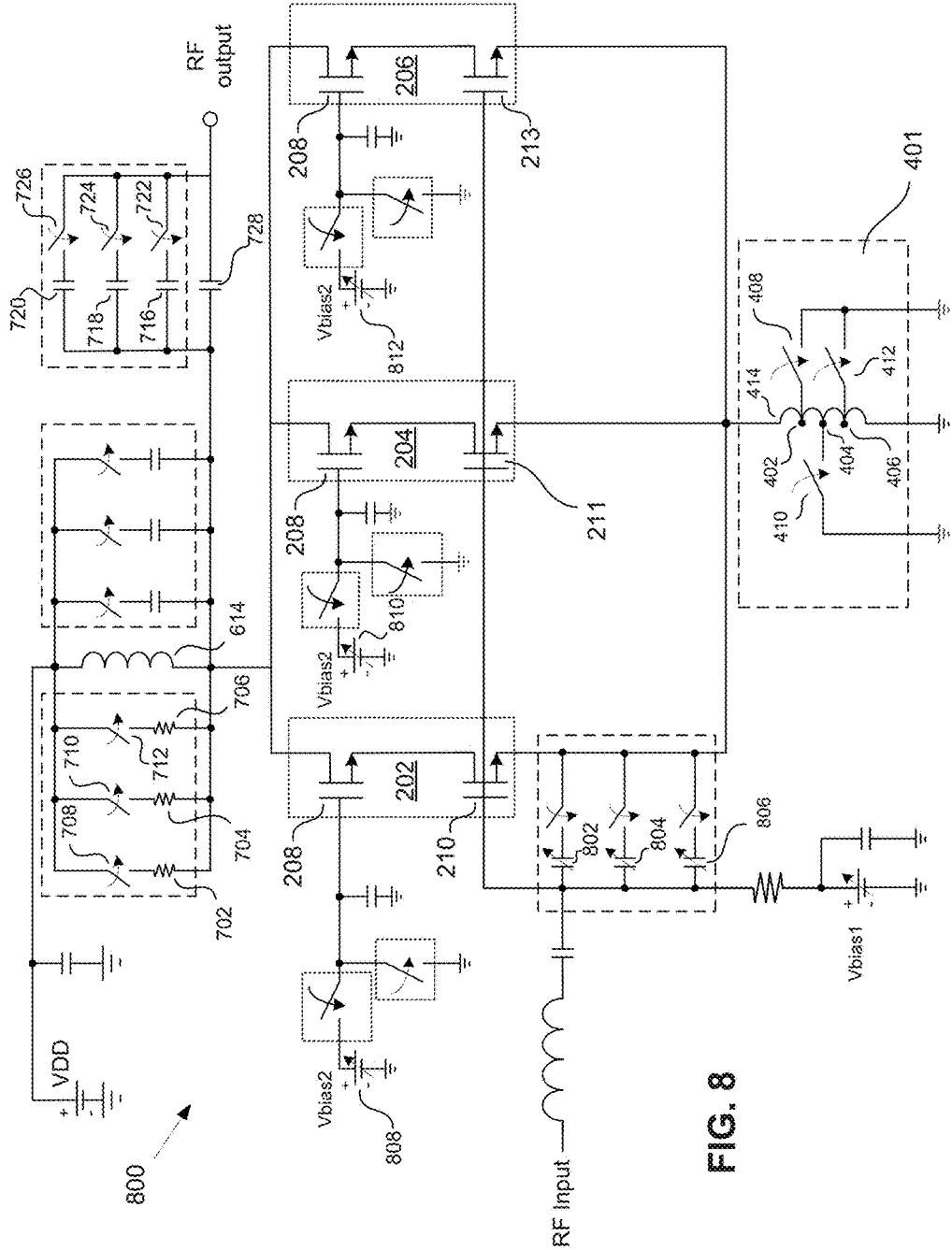
FIG. 8 is a simplified schematic of the LNA of FIG. 7, additionally having a bank of post fabrication variable capacitors selectively placed in parallel with the gate to source capacitance $C_{GS}$ of the three common source amplifiers.

FIG. 8 is a simplified schematic of one more embodiment of an LNA 800 having a selectable inductance degeneration inductor module 401 and in which a bank of variable capacitors 802, 804, 806 are selectively placed in parallel with the gate to source capacitance $C_{GS}$ of the three common source amplifiers, such as FETs 210, 211, 213. In some embodiments, the capacitors 802, 804, 806 are "post fabrication variable". That is, the amount of capacitance can be adjusted after fabrication of the other components of the amplifier branch 202, 204, 206. By making the value of these capacitors 802, 804, 806 variable, variations during fabrication that can affect parameters of interest of the LNA 800 (such as the IIP3, noise figure, input second order intercept (IIP2), output impedance, input impedance, etc.) can be compensated for after fabrication is complete. In some embodiments, the capacitors 802, 804, 806 are each Metal-Insulator-Metal (MIM) capacitors that can be laser trimmed to the desired capacitance after the LNA 800 has been fabricated. Alternatively, additional capacitors and associated switches can be provided to increase the range of capacitance that can be varied after fabrication with selectively coupling the additional capacitors through the additional switches. The capacitors 802, 804, 806 are shown in FIG. 8 as three variable capacitors. However, in some embodiments, each capacitor 802, 804, 806 may comprise a fixed capacitor in parallel with (or in series with) a MIM capacitor that can be laser trimmed to yield the desired total capacitance for each capacitor 802, 804, 806 shown or several additional capacitors and associated switches. In addition, the bias voltage $V_{bias2}$ applied to the gate of each of the three common gate amplifiers (such as FET 208) is generated using variable voltage sources 808, 810, 812. In some embodiments, the bias voltages are the same and may be generated by the same source. However, in other embodiments, a unique bias voltage source is provided for each of the common source and common gate FETs in each branch. Still further, in some embodiments, a subset of the FETs may share a common bias voltage source, while other FETs either share another bias voltage source or have a unique bias voltage source.

Throughout this disclosure, the terms "resistor", "capacitor" and "inductor" have been used in the general sense to indicate an element that imposes resistance, capacitance and inductance, respectively. It should be understood that these terms can be interpreted to mean any element, either lumped or distributed, that can impose resistance, capacitance and inductance, respectively. Likewise, the term "switch" has been used through the disclosure to mean any circuit element that can selectively impose either a relatively high impedance (i.e., open) in a first state and a relatively low impedance (i.e., closed) in a second state. In some embodiments, these switches are transistors, such as FETs, bipolar transistors or otherwise. However, any other element capable of switching from a relatively high impedance to a relatively low impedance can be used where practical.

Figure 9:
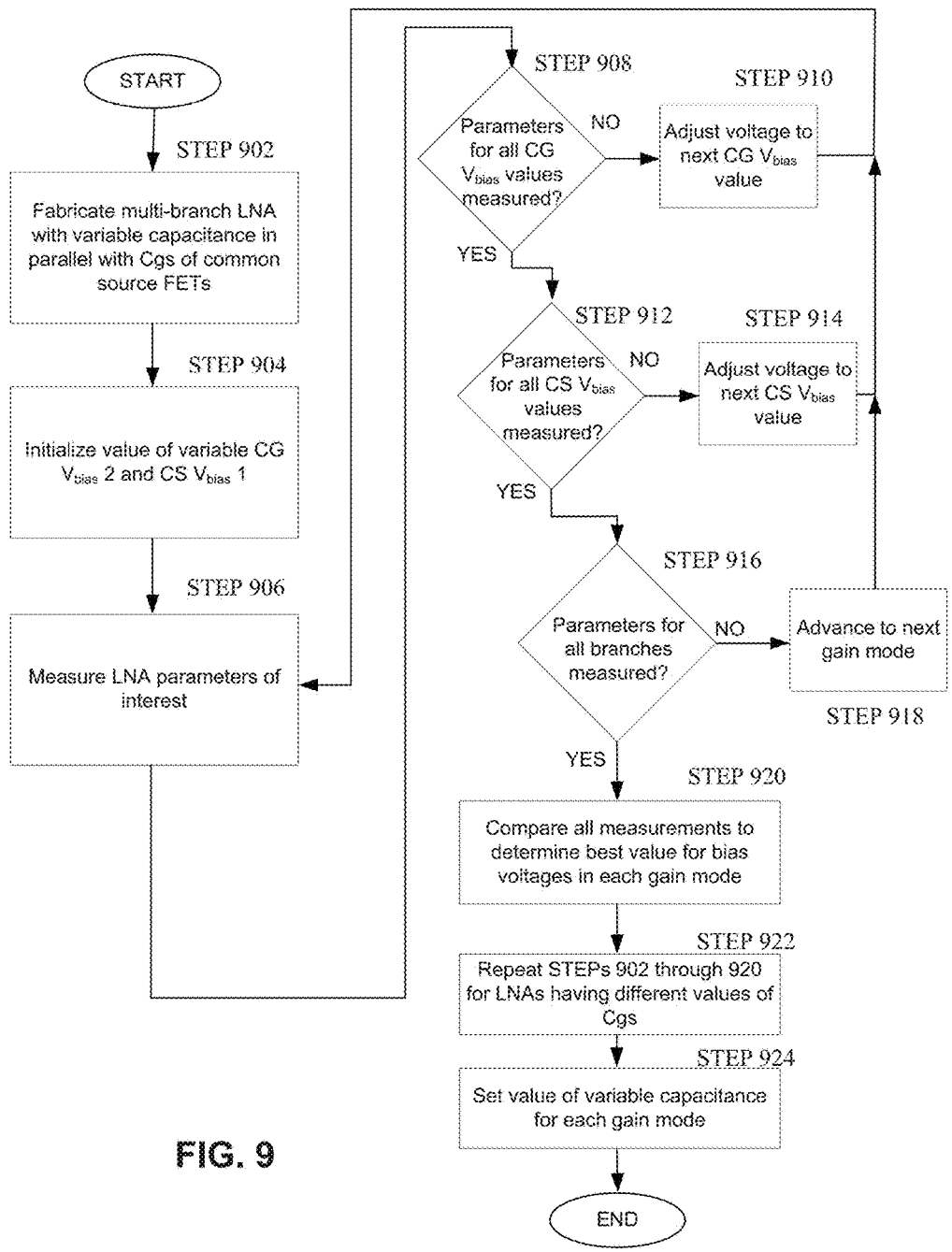
FIG. 9 is a flowchart of a process used to make an LNA having capacitors tuned to values that account for variations in the parameters of components of the LNA during fabrication of the LNA.

FIG. 9 is a flowchart of a process used to make an LNA 800 having capacitors 802, 804, 806 tuned to values that account for variations in the parameters of components of the LNA during fabrication of the LNA 800. The process begins with the fabrication of LNAs 800 including capacitors 802, 804, 806 that can be adjusted, such as by laser trimming a MIM capacitor, after fabrication (STEP 902). Once the LNAs 800 have been fabricated, at least one of the LNAs 800 is selected. For the selected LNA 800, initial values are set for capacitance for the three capacitors 802, 804, 806 and for the common gate (CG) bias voltage $V_{bias2}$ applied to each of the common gate FETs 208 and for the common source (CS) bias voltage $V_{bias1}$ applied to the common source FETs 210 (STEP 904).

Next, at least one LNA parameter of interest, such as the IIP3, noise figure, input second order intercept (IIP2), output impedance, input impedance, etc., is measured at the initial values of CG bias and CS bias for a first bias mode in which the first branch 202 is turned on and each of the other branches 204, 206 are turned off (STEP 906). If measurements have not been made at all of the CG bias voltages for which measurements are to be made (STEP 908), then the CG bias voltage for the branch that is currently turned on is adjusted to the next value (STEP 910). The parameters of interest are measured for that CG bias voltage (STEP 906). STEPs 906, 908 and 910 are repeated until the answer to the decision block in STEP 908 is "YES" (i.e., parameter measurements for all of the bias voltage levels have been made).

Upon making measurements of the parameters of interest at each CG bias voltage level, a decision is made as to whether parameter measurements have been made for all of the CS bias voltage values (STEP 912). If not, then the CS bias voltage is set to the next level at which parameter measurements are to be made (STEP 914). The next measurement is made (STEP 906) and the process again repeats STEP 906 through STEP 914 until the answer to the decision block in STEP 912 is "YES".

Once the answer to the decision block in STEP 912 is "YES", a determination is made as to whether parameter measurements for all of the branches 202, 204, 206 have been completed. If not, then the next branch is turned on and each of the other branches is turned off (STEP 918). Once the answer to the decision block in STEP 916 is "YES", the parameter measurements are analyzed to determine the CS bias voltage and CG bias voltage that results in desired operational parameters of the components of the LNA 800 (STEP 920).

The process performed in STEPs 902 through 920 are repeated for other LNAs 800 from the same fabrication lot (i.e., that were fabricated together and thus have the same operational characteristics), but with different values of capacitance for the capacitors 802, 804, 806. This process is repeated until parameters of interest for LNAs 800 having all desired values of capacitance for the post fabrication variable capacitors 802, 804, 806 have been measured (STEP 922). The parameter measurements are then analyzed to determine the amount of capacitance (e.g., the size) of the variable capacitors 802, 804, 806 necessary to compensate for any variations from the ideal operational parameters of the LNA 800. The value of each of the variable capacitors 802, 804, 806 for the remaining LNAs of the lot are then set (STEP 924). In some embodiments, the capacitors 802, 804, 806 are MIM capacitors that can be laser trimmed, as noted above. Therefore, the values are set by laser trimming each capacitor to the appropriate size indicated by the parameter measurements made in STEP 906.

In some embodiments, the process of FIG. 9 is performed on samples taken from a lot of LNAs that were fabricated together (i.e., LNAs for which the components all have the same performance parameters). The MIM capacitor of each of the samples can be trimmed to different values and the process of FIG. 9 performed on each sample to determine which sample has the most desirable parameters of interest. In some embodiments, the MIM capacitor 802, 804, 806 of a first sample can be trimmed to a size that provides values of 20% of the impedance resulting from $C_{gs}$ of the common source FET 210. Other samples can have the capacitors 802, 804, 806 trimmed to other values, such as 30%, 40% or 0% of $C_{gs}$. Once the measurements of STEP 906 are all completed for each sample, the sample having the best operational characteristics can be used as a model for determining the size of the capacitors 802, 804, 806. In some embodiments, the MIM capacitors of the remaining LNAs 800 that were fabricated together with the samples that were measured are trimmed to the same value as the LNA 800 having the best measurements for the particular application for which the LNA 800 is to be used. Alternatively, a new LNA 800 can be designed based on the measurements made on the samples and the process repeated using the new design and taking samples from the resulting LNAs 800.

Figure 10:
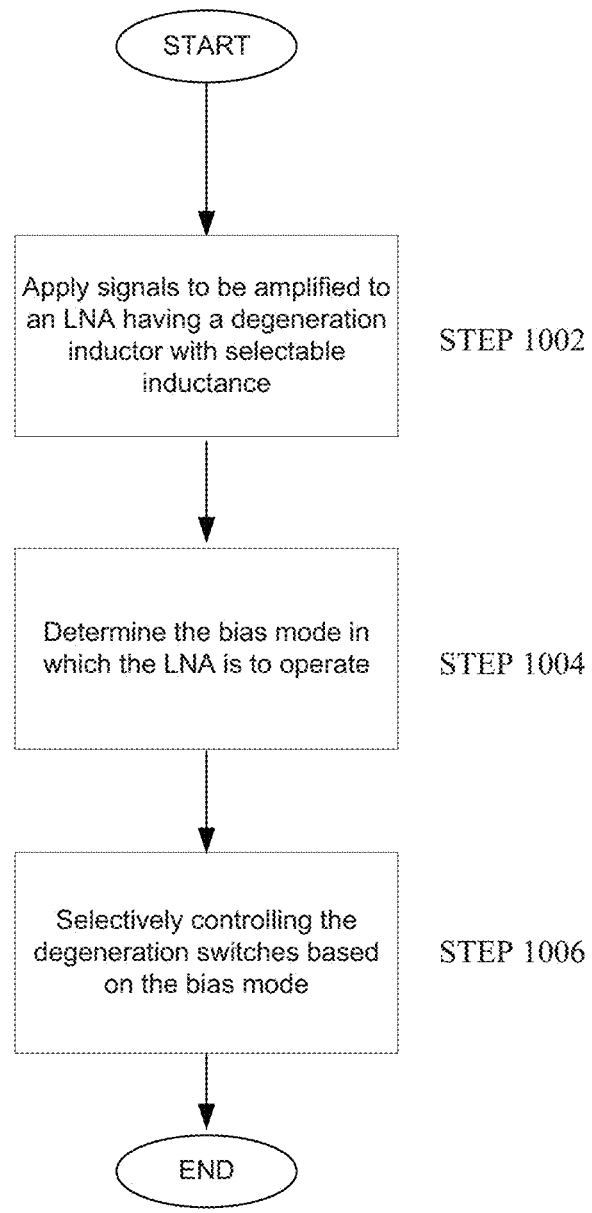
FIG. 10 is a flowchart of a method for compensating for changes in input impedance that would otherwise occur with changes in the bias mode of an LNA.

FIG. 10 is a flowchart of a method for compensating for changes in input impedance that would otherwise occur with changes in the bias mode of an LNA. Initially, signals that are to be amplified are coupled to the input of an LNA having a degeneration inductor that has selectable inductance (STEP 1002). In some embodiments, the degeneration inductor has taps. Each tap is coupled to ground through a switch, such that selectively opening and closing the switches provides a means by which the effective length of the inductor, and thus the inductance, of the degeneration inductor can be determined as a function of which switches are closed and which are open.

Next, a determination is made as to the bias mode in which the LNA is to operate. In some embodiments, the determination of the bias mode includes determining which of amplifier branches are turned on (STEP 1004). Once the bias mode is determined, the degeneration switches 408, 410, 412 are selectively controlled (e.g., opened or closed), based on the bias mode (STEP 1006). That is, for each bias mode, a control signal is provided to each switch 408, 410, 412 to place the switches in an associated position (i.e., open or closed) to establish an appropriate amount of degeneration inductance for that particular bias mode. In some embodiments, the control signals are generated by the gain control module. In some embodiments, the inductance of the degeneration inductor is such that the input impedance of the LNA is matched to the output impedance of the source of the signal to be amplified. In some embodiments, the determination as to which switches 408, 410, 412 are to be open and which closed is made based on simulations prior to fabrication of the LNA. Therefore, the gain control module is preprogrammed to open and close the switches 408, 410 412 as appropriate. Alternatively, measurements can be made after the LNA has been fabricated. Such measurements can then be used to determine the best configuration of switch positions for the switches 408, 410, 412 for each bias mode.

Fabrication Technologies and Options

As should be readily apparent to one of ordinary skill in the art, various embodiments of the disclosed apparatus can be implemented to meet a wide variety of specifications. Unless otherwise noted above, selection of suitable component values is a matter of design choice and various embodiments of the claimed invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon CMOS, silicon-on-insulator (SOI), silicon-on-sapphire (SOS), silicon germanium HBT (SiGe), GaN HEMT, GaAs pHEMT, and MESFET technologies. However, in some cases, the concepts claimed may be particularly useful with an SOI-based fabrication process (including SOS), and with fabrication processes having similar characteristics.

A number of embodiments of the claimed invention have been described. It is to be understood that various modifications may be made without departing from the spirit and scope of the claimed invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims.

What is claimed is:

1. An amplifier including:
   (a) a plurality of amplifier branches;
   (b) a plurality of branch control switches, each branch control switch coupled to a corresponding amplifier branch;
   (c) a degeneration module including:
      (1) a degeneration inductor having at least one tap; and
      (2) at least one degeneration switch having a first terminal coupled to a corresponding one of the taps and a second terminal coupled to ground;
   wherein the degeneration switches have a control input and wherein the amplifier further includes a gain control module having at least one switch control output, each switch control output coupled to the control input of a corresponding one of the degeneration switches.

2. The amplifier of claim 1, wherein the branch control switches have a control input coupled to a corresponding one of the switch control outputs of the gain control module.

3. The amplifier of claim 2, wherein the gain control module coordinates the control of the degeneration switches with control of the branch control switches.

4. The amplifier of claim 3, wherein:
   (a) the amplifier has at least two bias modes determined by the state of the branch control switches;
   (b) the transconductance of the amplifier is different for least two of the bias modes; the amplifier further has an input impedance;
   (c) the input impedance is in part dependent upon the total transconductance of the amplifier; and
   (d) coordination of the degeneration switches with the branch control switches mitigates changes to the input impedance of the amplifier resulting from changes in the transconductance of the amplifier.

5. An amplifier including:
   (a) a plurality of amplifier branches;
   (b) a plurality of branch control switches, each branch control switch coupled to a corresponding amplifier branch;
   (c) a degeneration module including:
      (1) a degeneration inductor having at least one tap; and
      (2) at least one degeneration switch having a first terminal coupled to a corresponding one of the taps and a second terminal coupled to ground;
   wherein the degeneration inductor is formed within an area of having a defined shape and the at least one degeneration switch is formed outside the area.

6. The amplifier of claim 5, wherein the area is a square area.

7. The amplifier of claim 5, wherein the area is a rectangular area.

8. The amplifier of claim 5, wherein the area is an octagonal area.

9. An amplifier including:
   (a) a plurality of amplifier branches;
   (b) a plurality of branch control switches, each branch control switch coupled to a corresponding amplifier branch;
   (c) a degeneration module including:
      (1) a degeneration inductor having at least one tap; and
      (2) at least one degeneration switch having a first terminal coupled to a corresponding one of the taps and a second terminal coupled to ground;
   wherein the number of amplifier branches is equal to the number of branch control switches.

10. An amplifier including:
    (a) a plurality of amplifier branches;
    (b) a plurality of branch control switches, each branch control switch coupled to a corresponding amplifier branch;
    (c) a degeneration module including:
       (1) a degeneration inductor having at least one tap; and
       (2) at least one degeneration switch having a first terminal coupled to a corresponding one of the taps and a second terminal coupled to ground;
    further comprising a plurality of selectable degeneration capacitors coupled to the source of the common source amplifier.

11. The amplifier of claim 10, further comprising a plurality of series degeneration cap switches, each series degeneration cap switch coupled to a corresponding degeneration capacitor.

12. The amplifier of claim 11, wherein:
(a) the amplifier has an input impedance;
(b) activating unique combinations of amplifier branches corresponds to unique bias modes; and
(c) combinations of the series degeneration cap switches are controlled together with the degeneration switches to mitigate changes to the input impedance that correspond to changes in the bias mode.

13. A method for amplifying comprising:
(a) applying an input signal to a plurality of amplifier branches;
(b) turning on each of the amplifier branches by means of a plurality of branch control switches, each branch control switch coupled to a corresponding amplifier branch; and
(c) selecting the inductance of a degeneration inductor having at least one tap by means of at least one degeneration switch having a first terminal coupled to a corresponding one of the taps and a second terminal coupled to ground;
wherein the degeneration switches have a control input and wherein the amplifier further includes a gain control module having at least one switch control output, each switch control output coupled to the control input of a corresponding one of the degeneration switches.

14. The method of claim 13, wherein the branch control switches have a branch control switch control input coupled to a corresponding one of the switch control outputs of the gain control module, the method further comprising controlling the branch control switches via the gain control module through the branch control switch control input.

15. The method of claim 14, further comprising coordinating the control of the degeneration switches with control of the branch control switches by means of the gain control module.

16. The method of claim 15, further comprising:
(a) operating the amplifier in at least two bias modes determined by the state of the branch control switches, the transconductance of the amplifier being different for least two of the bias modes;
(b) establishing the input impedance by setting the total transconductance of the amplifier; and
(c) coordinating the degeneration switches with the branch control switches to mitigate changes to the input impedance of the amplifier resulting from changes in the transconductance of the amplifier.

* * * * *